(12) United States Patent
Ylonen

(10) Patent No.: US 7,796,059 B2
(45) Date of Patent: Sep. 14, 2010

(54) FAST APPROXIMATE DYNAMIC HUFFMAN CODING WITH PERIODIC REGENERATION AND PRECOMPUTING

(75) Inventor: Tatu J Ylonen, Espoo (FI)

(73) Assignee: Tatu Ylonen Oy, Espoo (FI)

( * ) Notice: Subject to any disclaimer, the term of this patent is extended or adjusted under 35 U.S.C. 154(b) by 122 days.

(21) Appl. No.: 12/354,835

(22) Filed: Jan. 16, 2009

(65) Prior Publication Data

US 2010/0182170 A1 Jul. 22, 2010

(51) Int. Cl.
*H03M 7/40* (2006.01)
(52) U.S. Cl. .......................... 341/65; 341/67
(58) Field of Classification Search ............ 341/65, 341/67
See application file for complete search history.

(56) References Cited

U.S. PATENT DOCUMENTS

| 6,771,824 B1 * | 8/2004 | Chiu et al. ............... 382/233 |
| 7,043,088 B2 * | 5/2006 | Chiu et al. ............... 382/233 |
| 7,071,853 B2 * | 7/2006 | Price ....................... 341/65 |
| 7,358,870 B2 * | 4/2008 | Bay ......................... 341/65 |

OTHER PUBLICATIONS

I. Witten et al: Managing Gigabytes: Compressing and Indexing Documents and Images, 2nd ed., Morgan Kaufmann, 1999, especially pp. 30-52.
Huffman, D.: A method for the construction of minimum-redundancy codes, Proc. Inst. Radio Engineers 40(9):1098-1101, 1952.
J. Vitter Design and Analysis of Dynamic Huffman Codes, J. ACM, 34(4):825-845, 1987.
Y. Okada et al: Self-Organized Dynamic Huffman Coding without Frequency Counts, Proceedings of the Data Compression Conference (DCC'95), IEEE, 1995, p. 473.
D. Knuth: Dynamic Huffman coding, J. Algorithms 6:163-180, 1985.
R. Gallager: Variations on a theme by Huffman, IEEE Trans. Inform. Theory, IT-24:668-674, 1978.
D. Jones: Application of splay trees to data compression, Communications of the ACM, 31(8):996-1007, 1988.

* cited by examiner

*Primary Examiner*—Khai M Nguyen

(57) ABSTRACT

A fast data compression method approximating dynamic Huffman coding for applications with exteremely large data sets is disclosed. The method includes periodic regeneration of the Huffman coding tables and use of precomputed information to speed up encoding and decoding.

8 Claims, 4 Drawing Sheets

401 COMPUTER READABLE SOFTWARE
DISTRIBUTION MEDIUM

402 PROGRAM CODE MEANS

FIG 4

FAST APPROXIMATE DYNAMIC HUFFMAN CODING WITH PERIODIC REGENERATION AND PRECOMPUTING

CROSS-REFERENCE TO RELATED APPLICATIONS

Not Applicable

INCORPORATION-BY-REFERENCE OF MATERIAL SUBMITTED ON ATTACHED MEDIA

Not Applicable

TECHNICAL FIELD

The invention relates to data compression in computer systems.

BACKGROUND OF THE INVENTION

General information on various data compression methods can be found in the book I. Witten et al: Managing Gigabytes: Compressing and Indexing Documents and Images, 2nd ed., Morgan Kaufmann, 1999.

Huffman coding (Huffman, D.: A method for the construction of minimum-redundancy codes, Proc. Inst. Radio Engineers 40(9):1098-1101, 1952) is an old and widely known data compression method. In general-purpose compression applications it has long since been surpassed by more modern compression techniques, such as arithmetic coding, Lempel-Ziv, Lempel-Ziv-Welch, LZ-Renau, and many other systems.

Several variations of Huffman coding exist for compressing dynamic data streams, i.e., data streams where the frequency distribution of the various tokens to be compressed is not known a priori or may change dynamically with time, even during the compression of a single data stream. Examples of dynamic Huffman coding schemes include J. Vitter: Design and Analysis of Dynamic Huffman Codes, J. ACM, 34(4):825-845, 1987; Y. Okada et al: Self-Organized Dynamic Huffman Coding without Frequency Counts, Proceedings of the Data Compression Conference (DCC' 95), IEEE, 1995, p. 473; D. Knuth: Dynamic Huffman coding, J. Algorithms 6:163-180, 1985; and R. Gallager: Variations on a theme by Huffman, IEEE Trans. Inform. Theory, IT-24:668-674, 1978.

Splay trees (D. Jones: Application of splay trees to data compression, Communications of the ACM, 31(8):996-1007, 1988) have also been tried as an alternative to dymamic Huffman coding, but they have been found to not achieve a good compression ratio according to Okada et al.

A problem with existing dynamic Huffman coding schemes is that they modify the coding tree every time a token is encoded or decoded. Since dynamic Huffman coding schemes typically utilize tree data structures, modifying them is fairly expensive. The codes changing constantly also makes decoding optimizations difficult, more or less forcing decoding to operate a bit at a time.

There are applications requiring a dynamic compressor with very high speed. One example is loading knowledge into a knowledge-intensive application during startup. Such applications may use knowledge bases of several terabytes, and may run on computers with tens or hundreds of gigabytes of main memory, and may require tens or hundreds of gigabytes of data to be loaded into main memory before they can operate at full performance. Loading such data amounts from persistent storage into the application's memory can be quite time consuming, especially if the loading is done over a communications network. For example, consider a computing cluster with a thousand computational nodes, each node loading 100 gigabytes of knowledge into its memory. The aggregate data amount is 100 terabytes; transmitting this over a network or out of a database at 10 gigabits per second would take 80000 seconds, or over 22 hours, just for the system to start up. Even just reading 100 gigabytes from current disks takes many minutes. In such systems, it is important to compress the data, but since every node will need to also decompress the 100 gigabytes of data, decompression will need to be extremely fast.

If the 100 gigabytes represents 5 billion objects, at a mere 100 nanoseconds per object (which is probably highly optimistic) the decoding would take 500 seconds of CPU time, which is a long time to start up the application. Likewise, since the data set will likely need to be frequently updated, encoding speed is important, or otherwise it will take hours or days to write a new data set.

Such data sets need to be processed in a single pass, and their token frequency distributions are not known a priori. A dynamic compression scheme is thus needed.

No known compression scheme fills these requirements with regards to performance.

BRIEF SUMMARY OF THE INVENTION

A very fast approximate dynamic Huffman coding method with periodic regeneration and precomputing is disclosed. While adapting to dynamic aspects of the data more slowly than existing compression methods, the disclosed method allows much faster compression and decompression than known methods while still providing good compression.

The basic idea is to use non-dynamic Huffman coding, but to collect statistics about the token distribution of the data, and periodically regenerate the Huffman coding tree. This makes possible a number of optimizations that make the method very fast; the optimizations utilize information precomputed from the Huffman coding tree (which precomputation is possible since the tree is not constantly changing). A synchronization mechanism is used to ensure that the decoder changes its codes at the same point as the encoder, while still allowing compatibility between data streams encoded with different parameters.

The method is called approximate, because it is not a really dynamic Huffman coding scheme in the sense the term was used by Knuth. The coder responds to changes in the frequency distributions slower than the Knuth or Vitter methods, resulting in slightly poorer compression ratios. However, in practical applications of the method the data streams to be compressed are very long/large, and tend to have long stretches with relatively stable frequency distributions, and thus in practice the compression ratio approaches that of the traditional dynamic Huffman coders.

The method disclosed here is much simpler and much faster than existing dynamic Huffman coding methods. It has been overlooked perhaps because of the relatively complex way the dynamic Huffman coding problem was originally defined by Knuth (and adaptive Huffman coding before it). Also, focus in earlier work on Huffman coding has been on the compression ratio, as that is more important in traditional compression applications. However, in the applications discussed here, the requirements are different and the old methods are no longer suitable.

Faster and more efficient compression and decoding methods also translate to lower power consumption in mobile devices. This may be important for handheld translators, dictionaries, or other devices processing large amounts of knowledge.

The disclosed method is also easily amenable for direct hardware implementation, at least for the encoding and decoding components that utilize precomputed information (Huffman coding tree construction would probably still be advantageously implemented in software).

BRIEF DESCRIPTION OF THE SEVERAL VIEWS OF THE DRAWING(S)

FIG. 4 illustrates a computer usable software distribution medium with computer usable program code means embodied therein.

DETAILED DESCRIPTION OF THE INVENTION

Figure 1:
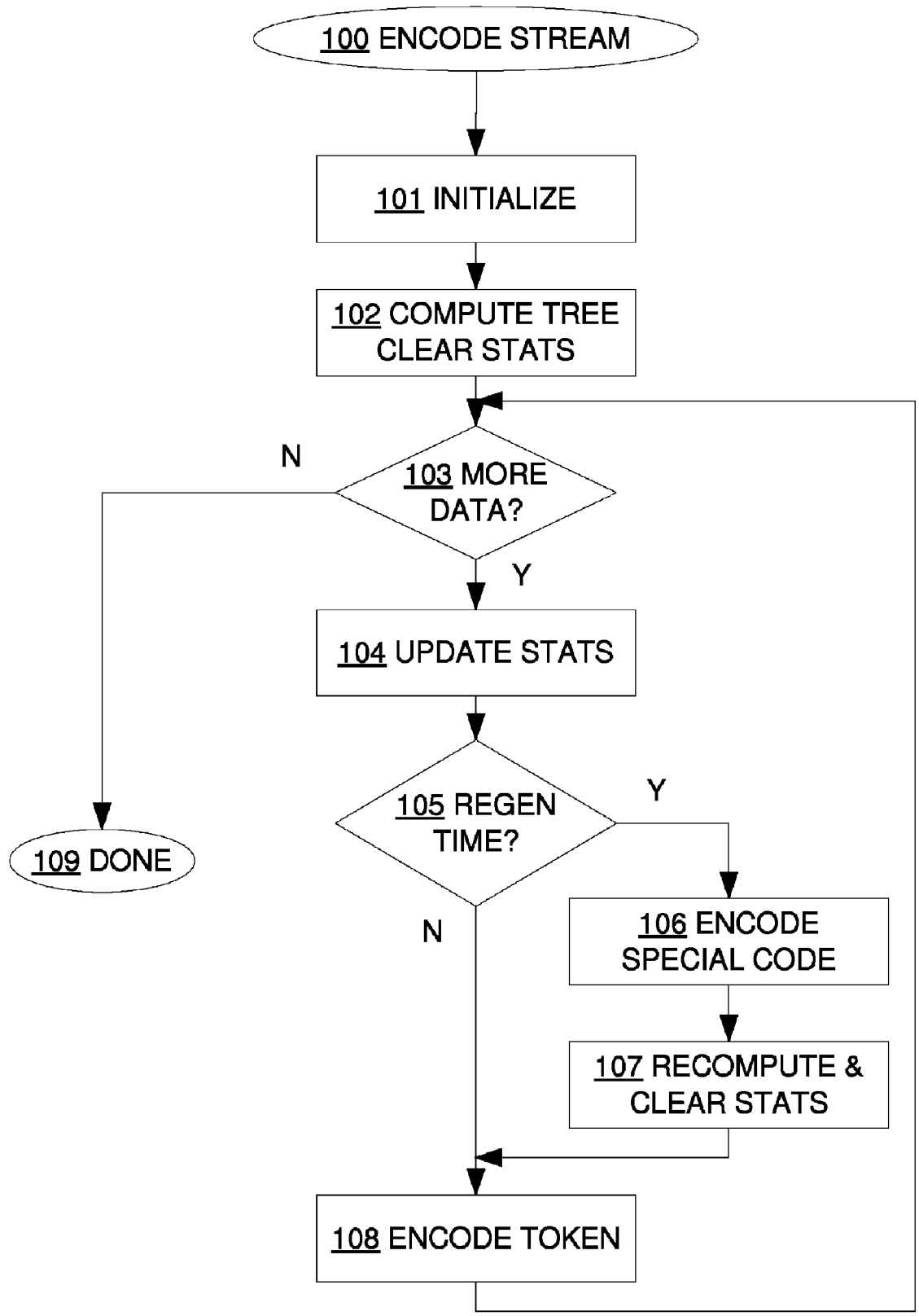
FIG. 1 illustrates encoding a data stream or file using the method.

FIG. 1 illustrates the encoding process (100) on a general level. At (101), the state of the encoder is initialized (for example, data structures are allocated). Among other things, this initializes variables related to determining when to next regenerate the coding trees. In the preferred embodiment, regeneration shall occur fairly soon (e.g., after outputting 32 tokens).

At (102), the Huffman coding tree is computed. Any known method for computing the Huffman coding tree can be used (for example, one utilizing a priority queue). At this point, no statistics may be available, in which case all counts used in the calculation are zero. Alternatively, application dependent initial counts may be used (e.g., by reading such counts from a file, where the counts from a previous run have been saved). The token frequency statistics are cleared. If it is desired that the coding tree represents the entire history so far, then clearing the statistics can be omitted here and in (107). The token frequency statistics comprise a counter for each distinct token that may be output. Precomputed information is also initialized at this step.

At (103), it is checked if there is more data to output. Note, however, that in an actual implementation, it is quite possible that the programming interface to the compression actually provides an initialization function and an encoding function, in which case the test whether more data is available may be implemented in the application outside the compression module, and the application calls the compression module to perform the actions in (104) to (108) for each token. Also note that the end of the data stream may be indicated using any suitable method, such as a special code reserved for the purpose, an application-level code that indicates that no more data is available, a count of tokens encoded earlier, etc.

At (104), the statistics about token frequencies are updated. To assist the test in (105), a count of all processed tokens is preferably maintained. Updating this count would also be one instruction on modern processors:

total_count++;

Statistics about the relative frequency of occurrence of each token should also be collected. In the preferred embodiment this is something like the following, which would usually translate to one instruction on modern processors. When regeneration occurs, this update should be done after regeneration if the code for the token triggering regeneration is sent using the new coding tree.

nodes[token_idx].count++;

At (105), it is tested whether the Huffman coding tree should be regenerated. This would typically be a comparison, which would probably be about two instructions on a modern processor:

if (total_count>regen_limit)

. . .

If regeneration is needed, execution continues from (106), where a special token is encoded (see below for details on fast encoding). The special token is a token value for which a code is allocated in the coding tree, but which is never sent by the application. In other words, the coding tree is built for (at least) one code more than is used by the application.

After sending the special code, execution continues by regenerating the coding tree in (107). Regenerating it preferably means computing a new table from scratch, as with standard Huffman coding (though an incremental update mechanism could conceivably also be used). Precomputed information is also updated accordingly. The statistics (including 'total_count') are then preferably cleared.

Also, it is determined here when to perform the next regeneration. The 'regen_limit' variable is set to the count when the next regeneration should occur. In the preferred embodiment, 'regen_limit' is doubled, until it reaches a configured maximum value, after which it is no longer increased. (There are many places where this computation and the compression could be placed; these are just the preferred locations.)

It should be noted that the regeneration limit can be freely configured in the encoder, and the limit does not affect decoding the stream (the compression ratio may, however, be somewhat affected).

Encoding then continues from (108), where the token from the application is encoded, making use of precomputed data. Encoding is described below in more detail.

(109) marks the end of the encoding process.

Figure 2:
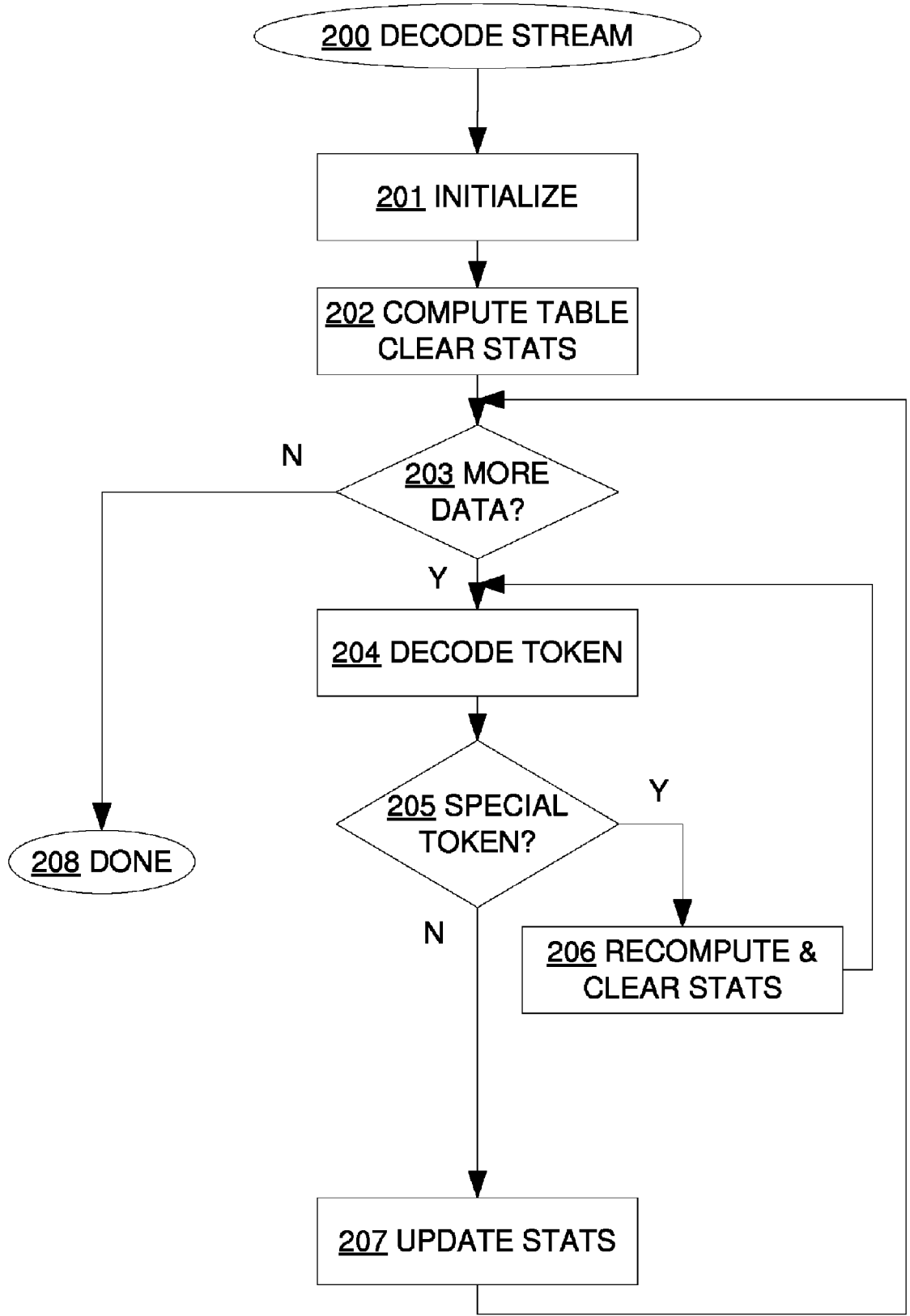
FIG. 2 illustrates decoding a data stream or file using the method.

FIG. 2 illustrates decoding a data stream or file (200). At (201), the state of the decoder is initialized (data structures allocated, etc).

At (202), the Huffman coding tree is computed (based on zero or initial statistics; note that if initial statistics are used, they must be identical on both the encoder and the decoder). Any precomputed information and statistics are initialized.

At (203), it is checked if there is more data to decode. As with encoding, the programming interface for compression may provide initialization and decoding functions, and the loop and this test may be implemented in the application outside the compression module.

At (204), a token is decoded from the input data stream. Decoding is described below in more detail.

At (205), it is tested whether the decoded token is the special token that indicates that the Huffman coding tree should be recomputed. If so, execution continues to (206), where the coding tree is recomputed based on the current statistics. Precomputed information is updated. The statistics would usually also be cleared here. After regeneration, execution returns to (204) to decode the next token from the input, which would usually be a normal token that can be returned to the application.

At (207), the statistics are updated. This would typically be something like the following. Note that there is no need to maintain 'total_count' while decoding.

nodes[token_idx].count++;

(208) marks the end of the decoding process.

Since the method is so time-critical, in an actual implementation of the method it is important to precompute as much as possible while generating the tables.

Huffman coders typically represent the coding tree as a binary tree or trie (at least in the decoder—in the encoder a table representation can be used). In the preferred embodiment, the coding tree is constructed as a binary tree, but optimized data structures are constructed from it to facilitate faster encoding and decoding. For encoding, a simple table is built that can be indexed by the token number. The table maps each token number to the corresponding node in the Huffman coding tree. Each node contains 'code' and 'send bits' fields (containing the node's Huffman code and the number of bits in the code, respectively). To encode a token, the node is looked up by indexing this table, and adding 'send bits' least significant bits of 'code' to the output. If codes larger than the size of the 'code' field are possible (typically the size is 32 or 64 bits), then an additional 'parent' field can be added, pointing to a parent node in the tree, the parent node also containing 'code', 'send_bits', and 'parent' fields. The code in the parent must be sent before the code for any node that has it as a parent. The 'code' is the code to be sent for the token number, determined by traversing the Huffman tree from the root to the node, and adding either a 0 or a 1 bit to the code depending on whether the token number can be found in the left or the right subtree (as is well known for Huffman encoding).

The encode function could be implemented similar to the following:

```
void encode(int token)
{
  void recurse(Node parent)
  {
    if (parent->parent != NULL)
      recurse(parent->parent);
    output(parent->code, parent->send_bits);
  }
  if (total_count > regen_limit)
  {
    regenerate_tables_and_clear_stats( );
    total_count = 0;
    regen_limit = 2 * regen_limit;
    if (regen_limit >= MAX_LIMIT)
      regen_limit = MAX_LIMIT;
  }
  Node node = nodes[token];
  if (node->parent != NULL)
    recurse(node->parent);
  output(node->code, node->send_bits);
  node->count++;
  total_count++;
}
```

Looking up the node to be encoded is shown here as indexing the 'nodes' table by the token number. However, it could also be implemented using other methods, such as by looking up a different kind of token (e.g., a string) from a hash table, the value in the hash table being the node or something from which the node can be determined.

To facilitate fast decoding, an optimized decoding table is computed in the preferred embodiment. Also, the interface to the input is such that the next 32 bits are made available (this could be any number of bits, with a specific minimum). The interface to the input is represented by the function peek( ), which returns the next 32 bits, and the function consume( ), which removes (or skips) a given number of bits from the input.

The basic idea is to use the next N bits in the input (where N must not be more than the minimum number of bits returned by peek( )), and index a 'fastdecode' table using those bits to obtain the node whose code begins with those bits. The 'fastdecode' table maps a bit sequence of N bits to the node with the longest code whose code is a prefix of the bits. To generate the 'fastdecode' table, a value for N is selected. Then, the Huffman coding tree is traversed up to the point where the code length is equal to N. For any leaf nodes reached (with code length<=N), any slots in the array whose indices have the code of the leaf node as their prefix (when viewing the index as bits) are set to point to the leaf node. For non-leaf nodes with code length of N, slot indexed by the code of the non-leaf node is set to point to that non-leaf node. Non-leaf nodes with codes shorter than N are not added to the table. Nodes with code length greater than N are ignored here.

To decode a token, code similar to the following can be used ('fastmask' contains the value 2^N-1 in two's complement notation; 'node->used_bits' is the number of bits in the node's code; node->links[ ] contains pointers to the left and right children of the node).

```
int decode( )
{
restart:
  unsigned int data = peek( );
  Node node = fastdecode[data & fastmask];
  unsigned int used = node->used;
  while (node is non-leaf node)
  {
    data >>= used;
    if (used >= 32)
    {
      consume(used);
      used = 0;
      data = peek( );
    }
    node = node->links[data & 1];
    data >>= 1;
    used++;
  }
  consume(used);
  if (node is the special token for recompute)
  {
    regenerate_tables_and_clear_stats( );
    goto restart;
  }
  node->count++;
  return node->token_num;
}
```

The fast encoding and decoding methods using precomputed information could also be used with static Huffman coding.

Since Huffman coding uses short codes for frequently occurring tokens, it is quite rare that decoding would need to iterate using additional bits to find a leaf node.

Several possible implementations for the peek( ), consume( ) and output( ) functions are known to one skilled in the art. They may also be implemented in-line, as macros, or interleaved with other operations.

Figure 3:
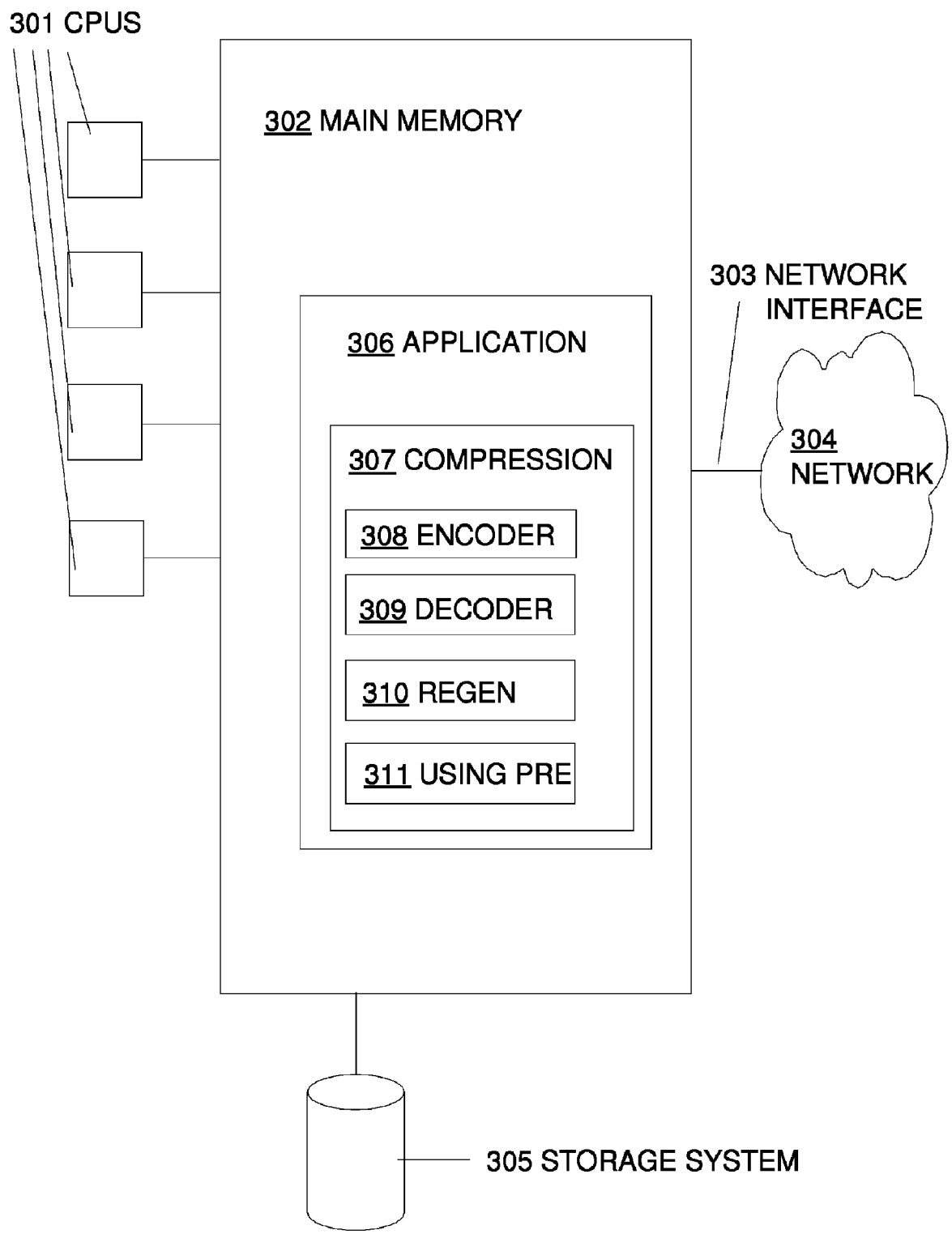
FIG. 3 illustrates a computer system based on a general-purpose computer with the method implemented in software within an application program.

Another aspect of the invention is a computing system that implements the method, typically using programs on a general purpose computer to implement each step of the method. The elements of the computing system comprise means for implementing each of the steps of the above described method. FIG. 3 illustrates the computing system, with (301) representing one or more processors, (302) representing the main memory, (303) representing the network interface, (304) representing a network (such as the Internet, a local area network, or a fast network internal to a computing cluster), (305) representing the storage system, (306) representing an application program, loaded into main memory from one or more computer usable software distribution media in the storage system or from media connected to the computing system through the network interface, (307) representing the compression means as described herein, including a precomputation-based Huffman encoding and/or decoding means and a means for collecting statistics about the encoded and/or decoded tokens, (308) representing the encoder component of the compression means, (309) representing the decoder component of the compression means, (310) representing the Huffman coding tree regeneration means for periodically regenerating the Huffman coding tree and precomputed information in the computing system, and (311) representing a means for using information precomputed from the Huffman coding tree. Some computer systems according to the present disclosure may not contain both encoding and decoding.

A third aspect of the invention is a computer usable software distribution medium (such as magnetic disc, semiconductor memory device, or optical device; the medium possibly also comprising a bus (e.g., USB) interface and a processor, as in a USB token or networked storage device) having computer usable program code means embodied therein for causing a computer system to implement the method, by causing the computer system to comprise means for implementing each step of the method. FIG. 4 illustrates the computer usable software distribution medium (401), with (402) illustrating a program code means for causing a computer system to perform approximate dynamic Huffman coding with periodic regeneration and precomputing, the computer usable program code means in said computer usable software distribution medium comprising: computer usable program code means for using precomputation-based Huffman coding for encoding or decoding a plurality of tokens; computer usable program code means for collecting statistics about the frequency with which each token is used; computer usable program code means for periodically regenerating the Huffman coding tree and precomputed information; and computer usable program code means for using information precomputed from the Huffman coding tree.

Nowadays Internet-based servers with disks and processors are commonly used for software distribution; with such media, the program would be copied into main memory or local persistent storage using a suitable network protocol, such as the HTTP or various peer-to-peer protocols, rather than, e.g., the SCSI, ATA, SATA, or USB protocols that are commonly used with local storage systems, optical disk drives, or USB tokens, or the iSCSI, CFS, or NFS protocols that are commonly used for loading software from media attached to a corporate internal network.

The method has been described in a context where tokens are integers and the number of possible tokens is known a priori. Without loss of generality, the tokens could also be other data types that are mapped to integers as a preprocessing step (in encoding, possibly using a hash table, and in decoding, possibly by storing the token value in the node used for decoding and retrieving the value from the node).

It is also possible to extend the method to a case where the number of tokens is not known a priori. In such cases a second special code would be defined for introducing new codes. The encoder would encode this code, allocate the next code for the token, then encode the token value using any convenient encoding (possibly without compressing it), and then update its encoding tables using any suitable method (e.g., as described by Vitter). The decoder would, upon receiving the second special code, read the token value from the input stream, and update its decoding tables correspondingly.

An application may encode/decode data into/from the same data stream between tokens encoded by a particular approximately dynamic Huffman coder instance using other approximate dynamic Huffman coder instances, other compression methods, or without compression. An example would be encoding multi-field structures using a separate coder instance for each field (the different fields probably have different distributions of values).

The variables and other data structures described herein would usually be mapped into a suitable "struct", object or class data structure. Fields could also be implemented for example as bit fields, as separate arrays, or as separate variables.

A token triggering regeneration of the coding tree could be encoded using either the old or the new tree.

A person skilled in the art can easily come up with variations of the method, including rearranging the various steps or interleaving them with other operations, without deviating from the essence of the invention.

What is claimed is:

1. An approximate dynamic Huffman coding method for use in a computing system, the method comprising in any order:
   using precomputation-based Huffman coding for encoding or decoding of a plurality of tokens
   collecting statistics about the frequency with which each token is used
   periodically regenerating the Huffman coding tree and precomputed information; and
   using information precomputed from the Huffman coding tree.

2. The method of claim 1, further comprising:
   precomputing the code and number of bits for each node in the Huffman coding tree; and
   encoding a plurality of tokens, the encoding for each token comprising:
      looking up a node corresponding to the token
      outputting a code for the token using the precomputed code and number of bits stored in the node; and
      for at least some tokens output, checking whether the coding tree should be regenerated, and if so, encoding a special code, regenerating the Huffman coding tree and precomputed information, determining when to next regenerate the coding tree, and encoding the token.

3. The method of claim 2, further comprising:
   checking whether the length of the code to be output exceeds the size of the code field, and if so, using a parent field to send the code for one or more parents of the node before sending the code for the node itself.

4. The method of claim 1, further comprising:
   precomputing a 'fastdecode' table
   precomputing a used number of bits value for each node
   decoding a plurality of tokens, the decoding for each token comprising:
      reading a plurality of bits from the input without removing them from the input
      using a plurality of the bits to index the 'fastdecode' table to obtain the node corresponding to those bits
      checking if the node is a non-leaf node, and if so, using following bits in the input to find a leaf node in the input
      determining the number of bits of the input that were actually used in decoding the token, and
      consuming those bits from the input; and
   checking whether the decoded token is the special token indicating Huffman coding tree regeneration, and if so, regenerating the Huffman coding tree, recomputing the precomputed information, and repeating the decoding step.

5. A computing system comprising a means for using approximate dynamic Huffman coding with periodic regeneration and recomputing, the means comprising:
   a precomputation-based Huffman coding means for encoding or decoding tokens
   a means for collecting statistics about the frequency with which each token is used
   a means for periodically regenerating the Huffman coding tree and precomputed information; and
   a means for using information precomputed from the Huffman coding tree.

6. The computing system of claim 5, further comprising:
   a means for precomputing the code and number of bits for each node in the Huffman coding tree; and
   a means for encoding a plurality of tokens, the means comprising:
      a means for looking up a node corresponding to the token
      a means for outputting a code for the token using the precomputed code and number of bits stored in the node; and
      a means for checking, for at least some tokens output, whether the coding tree should be regenerated, and if so, encoding a special code, regenerating the Huffman coding tree and precomputed information, determining when to next regenerate the coding tree, and encoding the token.

7. The computing system of claim 5, further comprising:
   a means for precomputing a 'fastdecode' table
   a means for precomputing a used number of bits value for each node
   a means for decoding a plurality of tokens, the means comprising:
      a means for reading a plurality of bits from the input without removing them from the input
      a means for using a plurality of the bits to index the 'fastdecode' table to obtain the node corresponding to those bits
      a means for checking if the node is a non-leaf node, and if so, using following bits in the input to find a leaf node in the input
      a means for determining the number of bits of the input that were actually used in decoding the token, and
      a means for consuming those bits from the input; and
      a means for checking whether the decoded token is the special token indicating Huffman coding tree regeneration, and if so, regenerating the Huffman coding tree, recomputing the precomputed information, and reactivating the decoding means.

8. A computer usable software distribution medium having computer usable program code means embodied therein for causing a computer system to perform approximate dynamic Huffman coding with periodic regeneration and recomputing, the computer usable program code means in said computer usable software distribution medium comprising:
   computer usable program code means for using precomputation-based Huffman coding for encoding or decoding a plurality of tokens
   computer usable program code means for collecting statistics about the frequency with which each token is used
   computer usable program code means for periodically regenerating the Huffman coding tree and precomputed information; and
   computer usable program code means for using information precomputed from the Huffman coding tree.

* * * * *